United States Patent
Vanoverschelde et al.

(10) Patent No.: US 6,734,767 B2
(45) Date of Patent: May 11, 2004

(54) DIPLEXER

(75) Inventors: Justine Vanoverschelde, Massy (FR); Georges Coury, Nanterre (FR); Lucien Loval, Wattignies (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/307,460

(22) Filed: Dec. 2, 2002

(65) Prior Publication Data

US 2003/0117232 A1 Jun. 26, 2003

(30) Foreign Application Priority Data

Dec. 6, 2001 (EP) .............................................. 01440412

(51) Int. Cl.[7] .............................................. H03H 11/48
(52) U.S. Cl. ........................ 333/214; 333/132; 333/217
(58) Field of Search ................................. 333/132, 134, 333/172, 174, 175, 213, 214, 217

(56) References Cited

U.S. PATENT DOCUMENTS

| 3,723,773 A | * | 3/1973 | Adams et al. ............... 327/552 |
| 5,548,255 A | | 8/1996 | Spielman |
| 5,726,613 A | * | 3/1998 | Hayashi et al. ............. 333/214 |
| 5,793,265 A | | 8/1998 | Spielman |
| 6,121,940 A | | 9/2000 | Skahill et al. |
| 6,424,209 B1 | * | 7/2002 | Gorecki et al. ............. 327/554 |

OTHER PUBLICATIONS

Lucuszyn S et al: "Monolithic Narrow–Band Filter Using Ultrahigh–Q Tunable Active Inductors" IEEE Transactions on Microwave Theory and Techniques, IEEE Inc. New York, US, vol. 42, No. 12, Dec. 1, 1994, pp. 2617–2622, XP000487010.

Salim Georges El Khoury: New Approach to the Design of Active Floating Inductors in MMIC Technology IEEE Transactions on Microwave Theory and Techniques, IEEE Inc. New York, US, vol. 44, No. 4, Apr. 1, 1996, pp. 505–512, XP000581753.

* cited by examiner

*Primary Examiner*—Robert Pascal
*Assistant Examiner*—Dean Takaoka
(74) *Attorney, Agent, or Firm*—Sughrue Mion, PLLC

(57) ABSTRACT

The invention refers to a diplexer, particularly for use in microwave devices, comprising a low-pass filter and a high-pass filter, both having inductors and capacitors. It is suggested that at least one inductor of each of said filters is provided as an active inductor.

5 Claims, 2 Drawing Sheets

Active Inductor

Spirale Inductor

Capacitor

—⦿— Active Inductor

—⦿— Spirale Inductor

—||— Capacitor

- ⎌ Active Inductor
- ⎌ Spirale Inductor
- ⊣⊢ Capacitor

DIPLEXER

The invention is based on a priority application EP 01 440 412.3 which is hereby incorporated by reference.

BACKGROUND OF THE INVENTION

The present invention relates to a diplexer, particularly for use in microwave devices, comprising a low-pass filter and a high-pass filter, both having inductors and capacitors.

Generally, a diplexer is a three-port frequency-dependent device that may be used for separating or combining signals. The diplexer comprises a low-pass filter for extracting signals in a low frequency band and a high-pass filter for extracting signals in a high frequency band. Both, the low-pass filter and the high-pass filter are designed as passive units using capacitors and inductors for realising the mentioned functions.

A diplexer as mentioned above is for example known from U.S. Pat. No. 5,793,265. This diplexer also comprises a high-pass filter and a low-pass filter and serves the function of separating an incoming television signal from an incoming telephony signal, so that each of these signals can be processed by separate receivers when in a private home. Each of the filters is constructed in the form of a ladder network having series branches and parallel branches. In the high-pass filter, the series branches comprise capacitors and the parallel branches comprise inductors, with one of the parallel branches having a series inductor-capacitor circuit. In the low-pass filter, the series branches comprise inductors and the parallel branches comprise capacitors, one of the parallel branches having an inductor-capacitor series circuit.

In this document, it is proposed that all of the inductors of both filters be constructed as toroids. However, the problem is that these passive components have a physical size which makes it difficult to further minimize the diplexer. Moreover, the inductors have a bad quality factor in a frequency range above 1 GHz.

It has also turned out that using active filters instead of the passive filters shown for example in the above-mentioned prior art document is not an appropriate approach to the mentioned problem due to the relatively poor characteristics of such active filters. These characteristics make them insufficient for use in diplexers.

In view of the above, it is the object of the present invention to provide for a diplexer as mentioned in the outset which overcomes the problems mentioned above. Particularly, it is an object of the present invention to provide for a diplexer having a compact design, a high quality factor and stability, and being less expensive than prior art diplexers.

SUMMARY OF THE INVENTION

This object is solved by a diplexer particularly for use in microwave devices, comprising a low-pass filter and a high-pass filter, both having inductors and capacitors, wherein at least one inductor of each of said filters is provided as an active inductor.

That means in other words that spiral inductors, like toroids, are replaced with active components being constituted by capacitors, resistors and transistors and having the electrical characteristic of an inductor. The advantage of the diplexer according to the present invention is a substantial reduction of size since an active inductor builds smaller than a corresponding spiral inductor. Preferably, a reduction of about 90% may be achieved.

A further advantage of the diplexer according to the present invention is a cost reduction of the diplexer due to smaller packaging. Hence, the diplexer according to the present invention is less expensive compared to prior art diplexers.

A further advantage of the diplexer according to the present invention is an approvement of the quality factor and the stability.

The diplexer according to the present invention may be designed using GaAs technology. However, it is preferred to implement the diplexer using SiGe technology since the consumption of the diplexer is lower.

In a preferred embodiment, said active inductor having an input and an output terminal, said terminals being connected by a first branch comprising a first resistor, a first capacitor, a drain-source path of a first transistor and a second capacitor; a second branch comprising a gate-source path of a second transistor, a source-gate path of a third transistor, a third capacitor, a gate-source path of said first transistor and said second capacitor; a third branch comprising a gate-drain path of said second transistor, a fourth capacitor and a second resistor; a fourth branch comprising said gate-source path of said second transistor, a source-gate path of said third transistor, a fifth capacitor and said second resistor; and a fifth branch comprising said gate-source path of said second transistor, said source-drain path of said third transistor, a sixth capacitor and said second resistor.

This design has turned out as advantageous in view of its electrical characteristics. However, it is to be understood that other designs may be possible and the present invention is not limited thereto.

In a further embodiment, the low-pass filter comprises series and parallel branches, the series branches having inductor elements and active inductors alternately arranged, and the parallel branches having inductor elements and capacitor elements serially connected. Preferably, said high-pass filter comprises series and parallel branches, the series branches having capacitor elements, and the parallel branches having either inductor elements or active inductors, and capacitor elements serially connected.

It is to be understood that other inductor elements of the low-pass and high-pass filters may be replaced with active inductors.

Further features and advantages can be taken from the following description and the enclosed drawings.

It is to be understood that the features mentioned above and those yet to be explained below can be used not only in the respective combinations indicated, but also in other combinations or in isolation, without leaving the scope of the present invention.

BRIEF DESCRIPTION OF THE DRAWINGS

An embodiment of the invention is shown in the drawings and will be explained in more detail in the description below with reference to same. In the drawings.

DETAILED DESCRIPTION OF THE INVENTION

Figure 1:
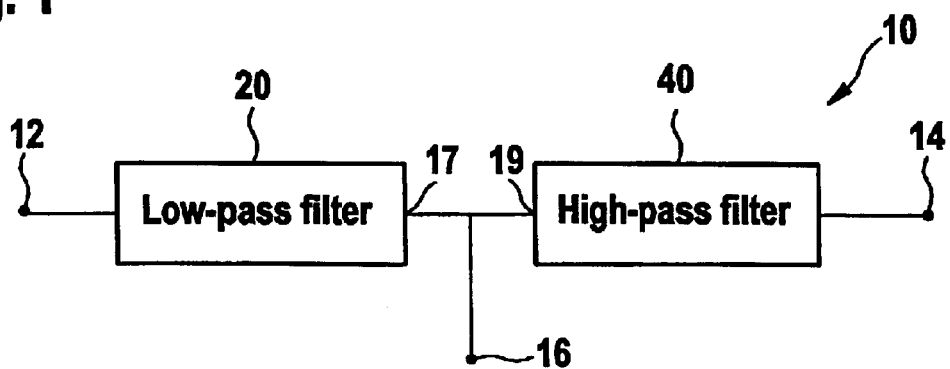
FIG. 1 is a schematic block diagram of a diplexer.

In FIG. 1, a diplexer is shown and indicated with reference number 10. The diplexer has three terminals 12, 14, 16, two of which 12, 14 serving as input terminals and the other terminal 16 serving as an output terminal in one operating mode. In a second operating mode, the function of the terminals is reversed, i.e. terminal 16 serves as input terminal and the other two terminals 12, 14 serve as output terminals.

The diplexer 10 comprises a low-pass filter 20 and a high-pass filter 40. The low-pass filter is coupled between the terminal 12 and the terminal 16, whereas the high-pass filter 40 is coupled between the terminal 14 and the common terminal 16.

In a first operating mode, the function of this diplexer is to combine two signals supplied to the terminals 12 and 14 and carrying information in a low frequency band and a high frequency band, respectively, to one signal carrying both information. This combined signal is supplied to terminal 16.

In a second operating mode, the function is reversed. I.e., a common signal carrying both information in a low and a high frequency band is separated by the low-pass filter 20 and the high-pass filter 40 in a first signal carrying the information in the low frequency band and a second signal carrying the information in the high frequency band, respectively. The first signal is supplied to terminal 12, while the second signal is supplied to terminal 14.

The field of application of such diplexers is broad. For example, diplexers are used in current dual-band mobile telephone devices in order to separate the frequency ranges 880 MHz–960 MHz and 1710 MHz–1880 MHz. However, it is to be understood that the present diplexer is not limited to this application.

Figure 2:
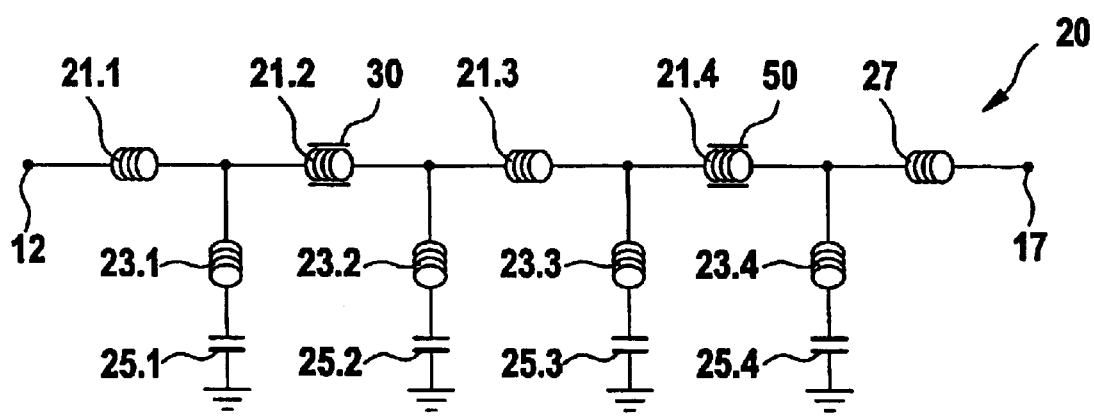
FIG. 2 is a schematic diagram of a low-pass filter having active inductors.

Referring to FIG. 2, the structure of the low-pass filter 20 is shown. The low-pass filter 20 is constructed as a four stage ladder network, wherein the first stage comprises an inductor 21.1 and an inductor 23.1 connected in series with a capacitor 25.1. The second, third and fourth stages are constructed similarly to the first stage and also comprise an inductor 21 and an inductor 23 connected in series with a capacitor 25 (the stage number follows the reference number delimited by 11.11). The series circuits of inductors 23 and capacitors 25 constitute parallel branches of the ladder network, and the inductors 21.1–21.4 constitute series branches of the ladder network. The low-pass filter 20 is terminated with a further inductor 27 coupling an output terminal 17 of the low-pass filter 20 with the common node of the series branch and the parallel branch of the fourth stage of the ladder network.

In FIG. 2, the inductors 21.2 and 21.4 of the series branch of the second stage and the fourth stage, respectively, are provided as active inductors 30. The design of the active inductor will be described in detail below with reference to FIG. 4. The remaining inductors 21.1, 21.3, 27, 23.1–23.4 are designed as spiral inductors, for example as coils.

Figure 3:
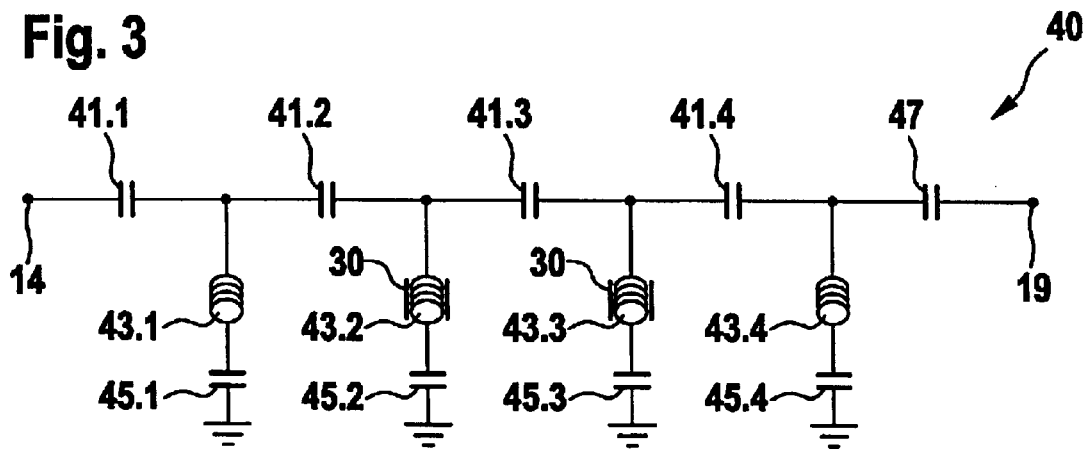
FIG. 3 is a schematic diagram of a high-pass filter having active inductors.

In FIG. 3, the design of the high-pass filter 40 is shown. It is also provided as a four stage ladder network comprising series and parallel branches between the terminal 14 and a second terminal 19 being connected with terminal 16 in the diplexer. Each of the series branches comprises a capacitor 41.1, 41.2, 41.3 and 41.4, respectively. The corresponding parallel branches each comprise a series circuit of an inductor 43.1–43.4 and a capacitor 45.1–45.4. The ladder network is terminated by a capacitor 47 coupling the terminal 19 with the common node of the series branch and the parallel branch of the fourth stage. Here, the digit of the reference number following the point indicates the stage number of the ladder network.

In the high-pass filter 40, the inductors 43.2, 43.3 of the second and third stage, respectively, are provided as active inductors 30.

Figure 4:
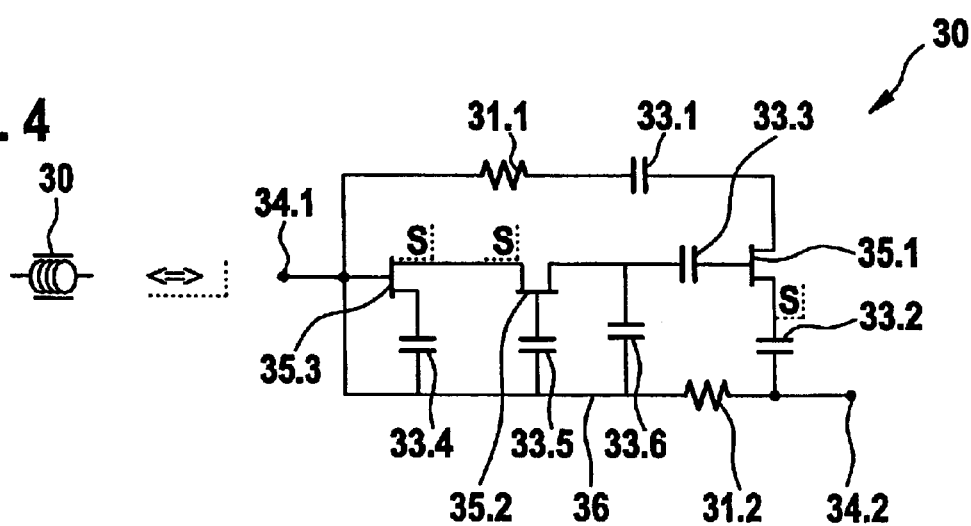
FIG. 4 is a schematic diagram of a preferred design of an active inductor used in the low-pass and high-pass filters shown in FIGS. 2 and 3.

With reference to FIG. 4, the design of an active inductor 30 will now be described in detail. The active inductor is constructed as a component using resistors, capacitors and transistors but no inductors. However, the electrical characteristic of this active inductor is very similar to that of a passive inductor like a toroid.

The active inductor 30 comprises a first resistor 31.1 connected in series with a first capacitor 33.1. This series circuit is coupled at its first end to a terminal 34 and at its second end to the drain of a first field effect transistor 35.1. The source of this transistor 35.1 is coupled to a second capacitor 33.2 which is in turn coupled to a further terminal 34.2.

The gate of the first transistor 35.1 is coupled to a third capacitor 33.3 which in turn is coupled to the drain of a second field effect transistor 35.2. The source of the second transistor 35.2 is coupled to the source of a third field effect transistor 35.3, the gate of which is coupled to the first terminal 34.1.

The drain of the third transistor 35.3 is connected to a node 36 via a fourth capacitor 33.4. The gate of the second transistor 35.2 is connected to said node via a fifth capacitor 33.5. Finally, the drain of the second transistor 35.2 is connected to said node 36 via a sixth capacitor 33.6.

A second resistor 31.2 connects said node 36 to said terminal 34.2.

It is to be understood that the described design is only a preferred design for an active inductor. A person skilled in the art will contemplate variations and modifications of this design without departing the scope of the present invention as defined in the claims. One major aspect of the present invention is to avoid the employment of passive inductors, like coils. According to the present invention, at least one such passive inductor is replaced with an active inductor showing substantially the same characteristic as a passive inductor, but using active elements, like transistors.

What is claimed is:

1. A diplexer, particularly for use in microwave devices, comprising a low-pass filter and a high-pass filter, both having inductors and capacitors, wherein at least one inductor of each of said filters is provided as an active inductor.

2. The diplexer of claim 1, wherein said active inductor consists of transistor) particularly field-effect-transistor, capacitor and resistor elements.

3. The diplexer of claim 1, wherein said active inductor having an input and an output terminal, said terminals being connected by
   a first branch comprising a first resistor, a first capacitor, a drain-source path of a first transistor and a second capacitor,
   a second branch comprising a gate-source path of a second transistor, a source-gate path of a third transistor, a third capacitor, a gate-source path of said first transistor and said second capacitor,
   a third branch comprising a gate-drain path of said second transistor, a fourth capacitor and a second resistor,
   a fourth branch comprising said gate-source path of said second transistor, a source-gate path of said third transistor, a fifth capacitor and said second resistor, and
   a fifth branch comprising said gate-source path of said second transistor, said source-drain path of said third transistor, a sixth capacitor and said second resistor.

4. The diplexer of claim 1, wherein said low-pass filter comprises series and parallel branches, the series branches having inductor elements and active inductors alternately arranged, and the parallel branches having inductor elements and capacitor elements serially connected.

5. The diplexer of claim 1, wherein said high-pass filter comprises series and parallel brunches, the series branches having capacitor elements, and the parallel branches having either inductor elements or active inductors, and capacitor elements serially connected.

* * * * *